United States Patent [19]

Okuhara

[11] Patent Number: 4,661,957
[45] Date of Patent: Apr. 28, 1987

[54] INPUT DATA READER APPARATUS FOR SWITCH ARRAY

[75] Inventor: Hiroo Okuhara, Tokyo, Japan

[73] Assignee: Kabushiki Kaisha Toshiba, Kawasaki, Japan

[21] Appl. No.: 660,127

[22] Filed: Oct. 12, 1984

[30] Foreign Application Priority Data

Oct. 14, 1983 [JP] Japan .................................. 58-191927

[51] Int. Cl.[4] ............................................. G06F 11/00
[52] U.S. Cl. .................................... 371/59; 340/365 E
[58] Field of Search ................. 371/56, 59; 340/365 E

[56] References Cited

U.S. PATENT DOCUMENTS

| | | | |
|---|---|---|---|
| 3,623,016 | 11/1971 | Winkler | 371/59 |
| 3,644,888 | 2/1972 | Marino | 371/59 |
| 3,792,466 | 2/1974 | Arnold | 371/59 |
| 4,231,016 | 10/1980 | Ueda | 340/365 |
| 4,413,314 | 11/1983 | Slater et al. | 364/188 |

FOREIGN PATENT DOCUMENTS

| | | | |
|---|---|---|---|
| 2925078 | 6/1979 | European Pat. Off. | |
| 69023 | 6/1979 | Japan | 371/59 |

OTHER PUBLICATIONS

Electronics/Apr. 19, 1984, "Touch Screens Let Your Fingers Provide a Fast, Simple Entry Into the Computer", pp. 140–144.

Holloway et al, "Controlled Switch-Matrix Keyboard," IBM Technical Disclosure, 10/1984, pp. 2779–2780.

IBM Technical Disclosure Bulletin, "Low-Cost Keyboard Scanner", pp. 5777–5778, vol. 25 11A, Apr. 1983, P. Jeanniot and R. Vautier.

*Primary Examiner*—Jerry Smith
*Assistant Examiner*—Robert W. Beausoliel, Jr.
*Attorney, Agent, or Firm*—Oblon, Fisher, Spivak, McClelland & Maier

[57] ABSTRACT

An input data reader apparatus includes a switch array or matrix which is formed of a plurality of switches and having input lines and output lines, one or more of the output lines being connected to one or more of the input lines according to a switch selection state of the switch array, a driver for supplying drive signals to the respective input lines of the switch array and defining input address data representing a line selection state of the input lines, and a buffer gate coupled to the output lines of the switch array and being responsive to sense signals which are obtained in accordance with the contents of the drive signals and with the switch selection state of the switch array, for generating output address data representing a line selection state of the output lines. The input data reader apparatus also includes a microcomputer coupled to the driver and the buffer gate, for detecting the combination of one or more simultaneously turned-on switches of the switch array according to the input address data and the output address data.

19 Claims, 12 Drawing Figures

FIG. 1 (PRIOR ART)
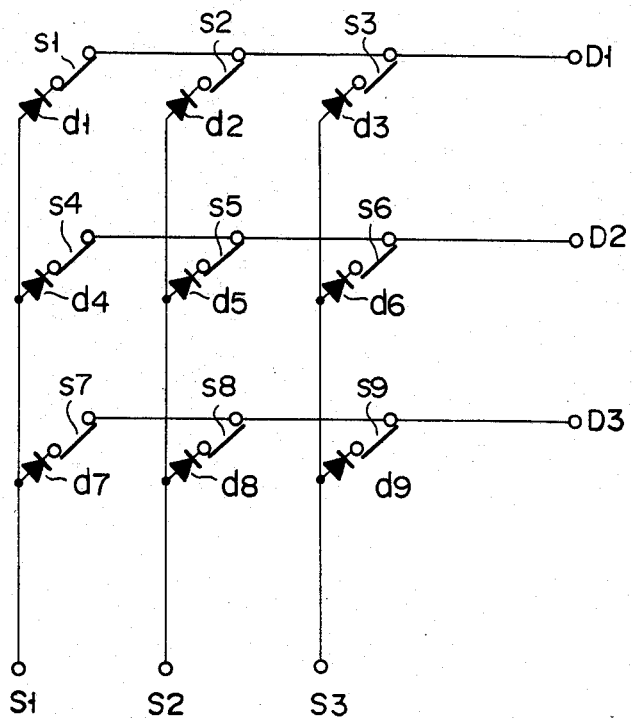
FIG. 2A $_{D1}$
FIG. 2B $_{D2}$
FIG. 2C $_{D3}$
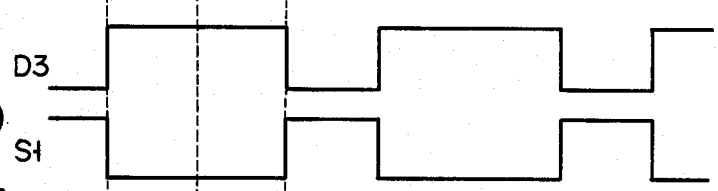
FIG. 2D $_{S1}$
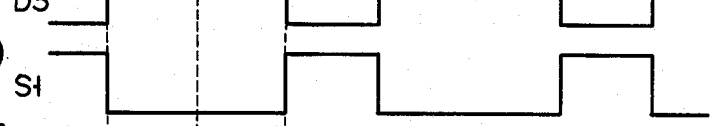
FIG. 2E $_{S2}$
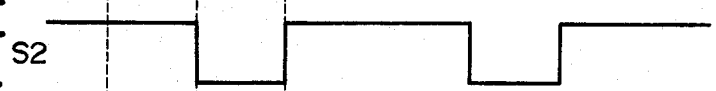
FIG. 2F $_{S3}$

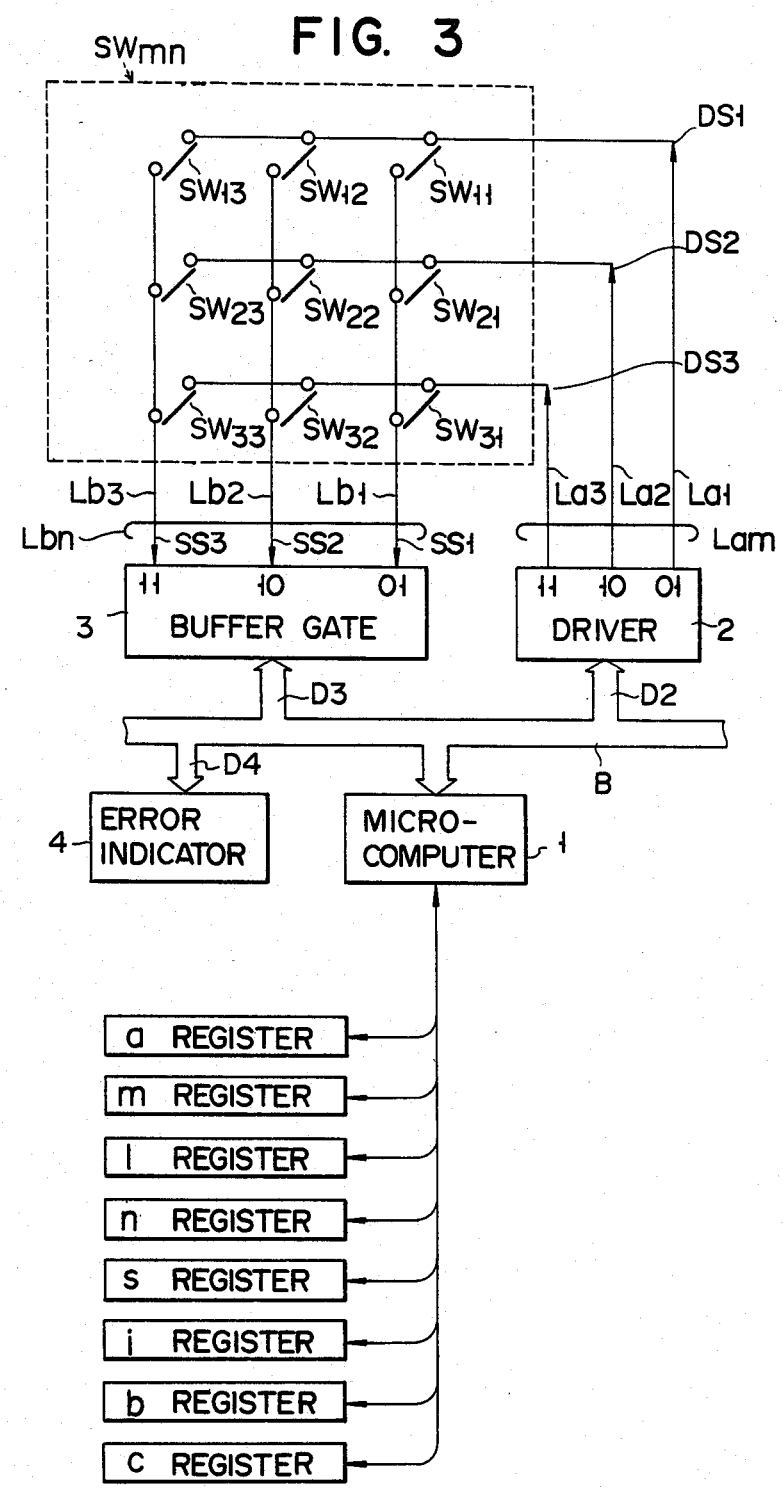

INPUT DATA READER APPARATUS FOR SWITCH ARRAY

BACKGROUND OF THE INVENTION

The present invention relates to an input data reader apparatus for a switch array (matrix) adapted to a touch panel or the like which is generally provided around the display location of a CRT (Cathode Ray Tube) display, an LCD (Liquid Crystal Display), etc.

A touch panel for manually inputting raw data is often provided at the front side of the display location of a CRT or LCD apparatus. Such a panel has a plurality (m x n) of switches arranged in a matrix fashion. Given drive signals are supplied to the matrix switches and the resultant logical output (sense signals) are derived from the matrix switches. The contents of inputted data of the touch panel or the combination of the depressed matrix switches are detected by an arithmetic logic unit (ALU) according to the sense signals. The detected contents of the inputted data are used thereafter for performing a prescribed operation.

In the manipulation of the matrix switches, two operation rules are generally applied. In the former rule, simultaneous depressing of two or more switches is inhibited. In the latter rule, simultaneous depressing of one or more switches in relation to the switching of another specific switch is allowed according to the specification or the function of the apparatus. For instance, in a process control performed by an operator's key board utilizing a touch panel, the former rule may be applied to a numerical input of 0 to 9 (ten-key input) or an alphabetic input, without any inconvenience. On the other hand, in a process control performed by a remote operation switch, two or more switches could be simultaneously depressed. In this case, the latter rule should be applied. Such simultaneous depressing may be done in a case wherein respective control target data for plural independent control loops should be inputted at the same time, or in a case wherein a plurality of key-input data (manipulation signals) should be outputted continuously. In order to correctly detect the combination of simultaneously depressed plural switches, signal leakages among the respective depressed switches should be eliminated. To eliminate such signal leakages, each of a conventional matrix switches is provided with a leakage-blocking diode as shown in FIG. 1.

FIG. 1 shows a conventional 3×3 switch matrix circuit having leakage-blocking diodes dj (j=1, 2, ..., 9). In FIG. 1, series-circuit of switches si (i=1, 2, ..., 9) and diodes dj are located at respective cross-points (nodes) of row (input) lines for drive signals D1 to D3 and column (output) lines for sense signals S1 to S3. The row lines receive drive signals D1 to D3, and column lines supply sense signals S1 to S3. When only the switches s1, s4 and s5 are turned on (depressed), the waveforms of drive signals D1 to D3 become as shown in FIGS. 2A to 2C and the waveforms of sense signals S1 to S3 become as shown in FIGS. 2D to 2F. According to the logical states of sense signals S1 to S3, an ALU (not shown) detects that the switches s1, s4 and s5 are depressed.

If diodes d1 to d9 are not provided in the circuit of FIG. 1, when switches s1, s2 and s4 are turned on, drive signal D2 leaks through the turned-on switches s1 and s2 to the column line of sense signal S2. Then, the said signal leakage occurs, and a correct detection of the combination of simultaneously depressed switches is disturbed.

From the above, if simultaneous depressing of two or more switches on the touch panel is not inhibited, diode dj cannot be deleted because of the signal leaking. In practice, however, it is difficut to mount the respective diodes dj closely to the switches si arranged on a touch panel. In such a case, the wiring for matrix switches si is not completed at the touch panel side. Rather, respective wirings of switches si are led out via independent contacts of a connector to the outside of the touch panel, and the matrix wiring is completed at the outside of the touch panel with the wiring of leakage-blocking diodes dj. This requires a large number of contacts in the connector and renders the matrix wiring with diodes dj complicated.

SUMMARY OF THE INVENTION

It is accordingly an object of the present invention to provide an input data reader apparatus for a switch array, which can correctly detect the combination of one or more simultaneously depressed switches without requiring leakage-blocking devices (diodes dj as shown in FIG. 1) arranged at the switch array.

Another object of the invention is to provide an input data reader apparatus for a switch array, which can indicate or inform a manipulation or detection error regarding the combination of one or more simultaneously depressed switches, if such an error occurs.

To achieve the former object, an input data reader apparatus of the invention includes, e.g., a switch matrix ($SW_{mn}$) being formed of m x n switches and having m row lines (Lam) and n column lines (Lbn); driver means (2) for supplying drive signals (DS1–DS3) to the respective row lines (Lam) of the switch matrix ($SW_{mn}$) and generating row address data (D2 or [m]) representing a line selection state of the row lines (Lam); buffer means (3) coupled to the column lines (Lbn) of the switch matrix ($SW_{mn}$) and being responsive to sense signals (SS1–SS3) which are obtained in accordance with the contents of the drive signals (DS1–DS3) and with a switch selection state of the switch matrix ($SW_{mn}$), for generating column address data (D3 or [a]) representing a line selection state of the column lines (Lbn); and detector means (1) coupled to the driver means (2) and the buffer means (3), for detecting the combination of one or more simultaneously turned-on switches according to the row address data (D2) and the column address data (D3).

To achieve the latter object, the detector means (1) of the above input data reader apparatus further has a function for sensing an error in the detection of the combination of one or more simultaneously turned-on switches so as to indicate or inform the error.

BRIEF DESCRIPTION OF THE DRAWINGS

FIG. 1 shows a conventional 3×3 switch matrix circuit (switch array) having leakage-blocking diodes dj;

FIGS. 2A to 2C show the waveforms of drive signals D1 to D3 in FIG. 1;

FIGS. 2D to 2F show the waveforms of sense signals S1 to S3 in FIG. 1;

FIG. 3 shows a configuration of an input data reader apparatus according to an embodiment of the present invention;

DETAILED DESCRIPTION OF THE PREFERRED EMBODIMENT

Figure 4:
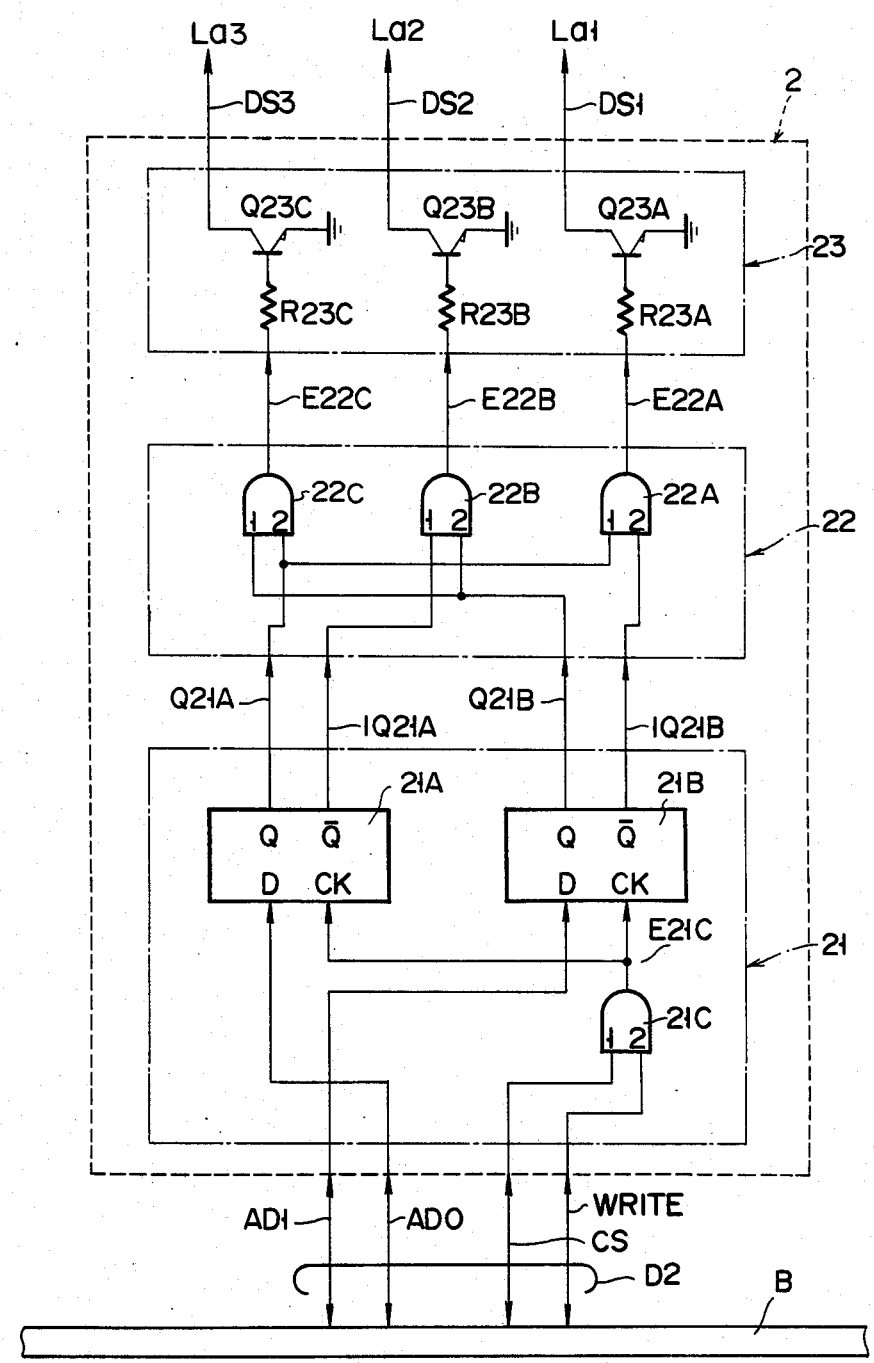
FIG. 4 shows an example of the configuration of driver 2 in FIG. 3.

A preferred embodiment of the present invention will be described hereinafter with reference to FIGS. 3 to 6A and 6B.

In FIG. 3, a switch array or switch matrix $SW_{mn}$ is formed of 9 (=3×3) switches $SW_{11}$ to $SW_{33}$ for the sake of simplicity. In an actual product, the number (=m×n) of switches in switch matrix $SW_{mn}$ may be much larger than 9, e.g., 256 (suffixes m and n are optional natural numbers). The reference numeral 1 denotes a microprocessor or microcomputer which controls a prescribed flow of FIGS. 6A and 6B. Microcomputer 1 may be a conventional one (e.g., #TLCS-47 type microcomputer developed by Toshiba Co., Japan; or #8048, #8748 or #8035 type microcomputer developed by Intel Co., U.S.A.) and is associated with 8 registers (a, m, l, n, s, i, b and c). Although not shown, microcomputer 1 contains an ALU, a program memory, a data memory, etc. The above 8 registers may be replaced with specific memory locations in the memory (RAM) of microcomputer 1.

Figure 5:
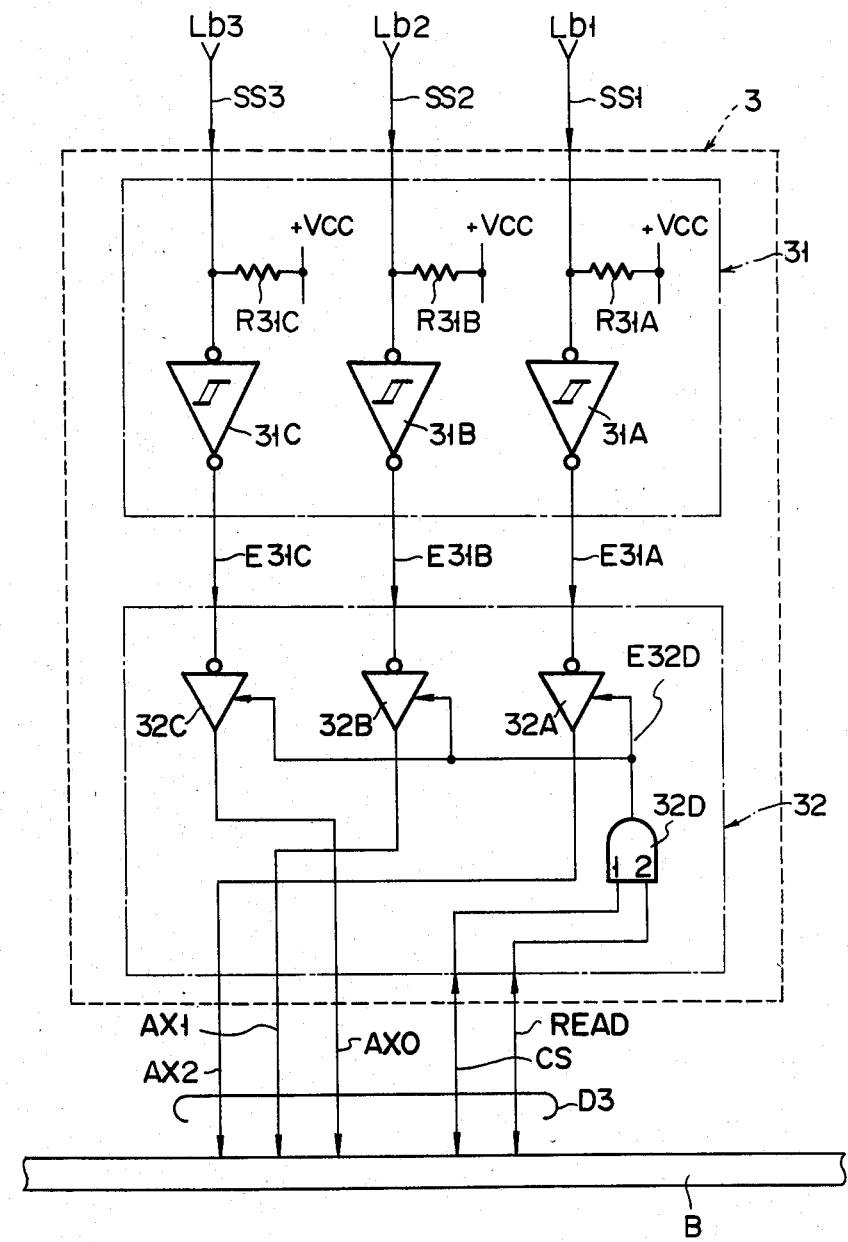
FIG. 5 shows an example of the configuration of buffer gate 3 in FIG. 3.

Microcomputer 1 is coupled via a bus B to a matrix driver 2. Driver 2 is responsive to input data D2 (address data AD0, AD1 and instructions CS, WRITE) from microcomputer 1. As shown in FIG. 4, driver 2 includes a data latch 21, address decoder 22 and line driver 23 connected to row lines (input lines) La1 to La3 of switch matrix $SW_{mn}$ (Inverted signals of outputs E22A to E22C from address decoder 22 may be directly connected to row lines La1 to La3, as the case may be.) Column lines (output lines) Lb1 to Lb3 of switch matrix $SW_{mn}$ are connected to a buffer gate 3. As shown in FIG. 5, buffer gate 3 includes a waveshaper circuit 31 and 3-state buffer circuit 32. Buffer gate 3 is responsive to sense signals SS1 to SS3 on lines Lb1 to Lb3 and fetches these signals according to instructions (CS, READ) sent from microcomputer 1 via bus B. Then, buffer gate 3 supplies address data AX0 to AX2 as a part of data D3.

Microcomputer 1 receives address data AX0 to AX2 via bus B from buffer gate 3. Address data AX0 to AX2 represent the contents of sense signals SS1 to SS3. Microcomputer 1 synthesizes a detection code "s" in accordance with address data AD0 and AD1 in data D2 and address data AX0 to AX2 in data D3.

The following reference tables are stored in the data memory or any other memory in microcomputer 1. Table 1 shows the configuration of l register which stores addresses for the contents [m] of row line number m (=1, 2, 3) of switch matrix $SW_{mn}$ when two or more bits of sense signals SS1 to SS3 include logic "1". Table 2 shows the configuration of n register which stores addresses for the contents [a] of a register when two or more bits of sense signals SS1 to SS3 include logic "1". Table 3 shows the configuration of s register which stores addresses for the contents [s] of detection code "s". Table 4 indicates the correspondence between the contents and the newly coded contents [a]. Table 5 indicates the correspondence between the ON of any of switches $SW_{11}$ to $SW_{33}$ and the contents of detection code "s". Table 6 indicates the correspondence between the combination of [1] & [n] and the contents [s] of detection code "s".

TABLE 1

| l | $l_0$ | — — — — — |
|---|---|---|
|   | $l_1$ | — — — — — |
|   | $l_2$ | — — — — — |

TABLE 2

| n | $n_0$ | — — — — — |
|---|---|---|
|   | $n_1$ | — — — — — |
|   | $n_2$ | — — — — — |

TABLE 3

| s | $s_0$ | — — — — — — — — — — — — — — — |
|---|---|---|
|   | $s_1$ | — — — — — — — — — — — — — — — |
|   | $s_2$ | — — — — — — — — — — — — — — — |
|   | $s_3$ | — — — — — — — — — — — — — — — |

TABLE 4

| [a] | NEWLY CODED [a] |
|---|---|
| 001 | 001 |
| 010 | 010 |
| 100 | 011 |

TABLE 5

| | SW 33 | SW 32 | SW 31 | SW 23 | SW 22 | SW 21 | SW 13 | SW 12 | SW 11 | [m] | [a] | [l] | [n] | [b] | [c] | [s] |
|---|---|---|---|---|---|---|---|---|---|---|---|---|---|---|---|---|
| 1 | | | | | | | | | 1 | 01 | 001 | | | | | 0101 |
| 2 | | | | | | | | 1 | | 01 | 010 | | | | | 0110 |
| 3 | | | | | | | | 1 | 1 | 01 | 011 | | | | | 0101 |
| | | | | | | | | | | | | | | | | 0110 |
| 4 | | | | | | | 1 | | | 01 | 100 | | | | | 0111 |
| 5 | | | | | | | 1 | | 1 | 01 | 101 | | | | | 0101 |
| | | | | | | | | | | | | | | | | 0111 |
| 6 | | | | | | | 1 | 1 | | 01 | 110 | | | | | 0110 |
| | | | | | | | | | | | | | | | | 0111 |
| 7 | | | | | | | 1 | 1 | 1 | 01 | 111 | | | | | 0101 |
| | | | | | | | | | | | | | | | | 0110 |
| | | | | | | | | | | | | | | | | 0111 |
| 8 | | | | | | 1 | | | | 10 | 001 | | | | | 1001 |
| 9 | | | | | | 1 | | | 1 | 01 | 001 | | | | | 0101 |
| | | | | | | | | | | 10 | 001 | | | | | 1001 |
| 10 | | | | | | 1 | | 1 | | 01 | 010 | | | | | 0110 |
| | | | | | | | | | | 10 | 001 | | | | | 1001 |
| *11 | | | | 1" | | 1 | | 1 | 1 | 01 | 011 | 01 | 011 | 110 | 011 | xxxx |
| | | | | | | | | | | 10 | 011 | 10 | 011 | 110 | 011 | xxxx |

TABLE 5-continued

| | SW 33 | SW 32 | SW 31 | SW 23 | SW 22 | SW 21 | SW 13 | SW 12 | SW 11 | [m] | [a] | [1] | [n] | [b] | [c] | [s] |
|---|---|---|---|---|---|---|---|---|---|---|---|---|---|---|---|---|
| 12 | | | | | | 1 | 1 | | | 01 | 100 | | | | | 0111 |
| | | | | | | | | | | 10 | 001 | | | | | 1001 |
| *13 | | | 1" | | | 1 | 1 | | 1 | 01 | 101 | 01 | 101 | 010 | 101 | xxxx |
| | | | | | | | | | | 10 | 001 | 10 | 101 | 010 | 101 | xxxx |
| 14 | | | | | | 1 | 1 | 1 | | 01 | 110 | 01 | 110 | | | 0110 |
| | | | | | | | | | | | | | | | | 0111 |
| | | | | | | | | | | 10 | 001 | | | | | 1001 |
| *15 | | | | 1" | 1" | 1 | 1 | 1 | 1 | 01 | 111 | 01 | 111 | 110 | 111 | xxxx |
| | | | | | | | | | | 10 | 111 | 10 | 111 | 110 | 111 | xxxx |
| 16 | | | | | 1 | | | | | 10 | 001 | | | | | 1001 |
| — | — | — | — | — | — | — | — | — | — | — | — | — | — | — | — | — |
| 64 | | 1 | | | | | | | | 11 | 001 | | | | | 1101 |
| — | — | — | — | — | — | — | — | — | — | — | — | — | — | — | — | — |
| 78 | | 1 | | | | | 1 | 1 | 1 | 01 | 110 | 01 | 110 | | | 0110 |
| | | | | | | | | | | | | | | | | 0111 |
| | | | | | | | | | | 10 | 001 | | | | | 1001 |
| | | | | | | | | | | 11 | 001 | | | | | 1101 |
| — | — | — | — | — | — | — | — | — | — | — | — | — | — | — | — | — |
| 255 | 1 | 1 | 1 | 1 | 1 | 1 | 1 | 1 | 1 | 01 | 111 | 01 | 111 | 001 | 111 | xxxx |
| | | | | | | | | | | 10 | 111 | 10 | 111 | 001 | 111 | xxxx |
| | | | | | | | | | | 11 | 111 | 11 | 111 | 001 | 111 | xxxx |

NOTE:
In Table 5, each of row numbers *11, *13 and *15 exemplifies a case wherein the said signal leakage occurs. The symbol 1" denotes an erroneously generated logic "1" level due to the signal leakage. The symbol xxxx denotes an inhibited condition due to the error. The symbol 1 denotes a normal logic "1" level obtained by the ON of any of matrix switches $SW_{mn}$. The blank portion denotes logic "0" level.

TABLE 6

| [1] | [n] | [s] |
|---|---|---|
| 01 | 011 | 0101; 0110 |
| 01 | 101 | 0101; 0111 |
| 01 | 110 | 0110; 0111 |
| 01 | 111 | 0101; 0110; 0111 |
| 10 | 011 | 1001; 1010 |
| 10 | 101 | 1001; 1011 |
| 10 | 110 | 1010; 1011 |
| 10 | 111 | 1001; 1010; 1011 |
| 11 | 011 | 1101; 1110 |
| 11 | 101 | 1101; 1111 |
| 11 | 110 | 1110; 1111 |
| 11 | 111 | 1101; 1110; 1111 |

The configuration of matrix driver 2 is shown in FIG. 4. When microcomputer 1 (FIG. 3) supplies supplies data D2 containing instructions CS & WRITE and address data AD0 & AD1 to bus B, then the D input of a D flip-flop 21A receives address data AD0, the D input of a D flip-flop 21B receives address data AD1, and the first and second inputs of an AND gate 21C receive instructions CS and WRITE, respectively. When the logic level of each of CS and WRITE becomes "1", an ANDed output E21C from gate 21C clocks D flip-flops 21A and 21B. Then, the logic level of AD0 is latched in flip-flop 21A and the logic level of AD1 is latched in flip-flop 21B. A Q output Q21A from flip-flop 21A is supplied to the first input of an AND gate 22A and to the second input of an AND gate 22C. A Q output Q21B from flip-flop 21B is supplied to the first input of AND gate 22C and to the second input of an AND gate 22B. An inverted Q output IQ21A from flip-flop 21A is supplied to the first input of AND gate 22B, and an inverted Q output IQ21B from flip-flop 21B is supplied to the second input of AND gate 22A.

An ANDed output E22A from gate 22A is supplied via a resistor R23A to the base of an NPN transistor Q23A. An ANDed output E22B from gate 22B is supplied via a resistor R23B to the base of an NPN transistor Q23B. An ANDed output E22C from gate 22C is supplied via a resistor R23C to the base of an NPN transistor Q23C. The emitter of each of transistors Q23A to Q23C is circuit-grounded. The collector of transistor Q23A supplies a drive signal DS1 of logic "0" on the first row line La1 when E22A is logic "1". The collector of transistor Q23B supplies a drive signal DS2 of logic "0" on the second row line La2 when E22B is logic "1". The collector of transistor Q23C supplies a drive signal DS3 of logic "0" on the third row line La3 when E22C is logic "1".

The configuration of buffer gate 3 is shown in FIG. 5. The first column line Lb1 of switch matrix $SW_{mn}$ is pulled up via a resistor R31A to a positive potential +Vcc which corresponds to logic "1". When none of switches $SW_{11}$, $SW_{21}$ and $SW_{31}$ is turned-on, the logic level of sense signal SS1 on line Lb1 becomes "1". When any of ONed transistors Q23A to Q23C (FIG. 4) is connected via any of ONed switches $SW_{11}$ $SW_{21}$ and $SW_{31}$ to line Lb1, the logic level of sense signal SS1 on line Lb1 becomes "0". Line Lb1 is coupled to a Schmitt trigger (waveshaper with a given input threshold level) 31A. When the potential of line Lb1 exceeds its input threshold level, Schmitt trigger 31A outputs a signal E31A with logic "1". When the potential of line Lb1 falls below the input threshold level, Schmitt trigger 31A outputs signal E31A with logic "0". Thus, Schmitt trigger 31A provides a wave-shaped signal E31A whose logic level represents the logic level of column line Lb1.

Similarly, a Schmitt trigger 31B coupled to the second column line Lb2 provides a wave-shaped signal E31B whose logic level represents the logic level of column line Lb2, and a Schmitt trigger 31C coupled to the third column line Lb3 provides a wave-shaped signal E31C whose logic level represents the logic level of column line Lb3.

Signals E31A, E31B and E31C are inputted to inverting 3-state buffers 32A, 32B and 32C, respectively. An output-open instruction E32D for each of 3-state buffers 32A to 32C is obtained from an AND gate 32D. The output circuit of each of buffers 32A to 32C is open-circuited by logic "0" of E32D. When E32D is logic "1", each of buffers 32A to 32C is enabled to serve as an inverting buffer. When microcomputer 1 (FIG. 3) supplies to bus B the data D3 containing instructions CS & READ of logic "1", the first and second inputs of AND gate 32D receive these instructions and gate 32D outputs the instruction E32D. When the logic level of E32D is "1", buffer 32C supplies to bus B the address data AX0 whose logic level corresponds to the inverted level of sense signal SS3, buffer 32B supplies to bus B the address data AX1 whose logic level corresponds to the inverted level of sense signal SS2, and buffer 32A supplies to bus B the address data AX2 whose logic level corresponds to the inverted level of sense signal SS1.

Figure 6A:
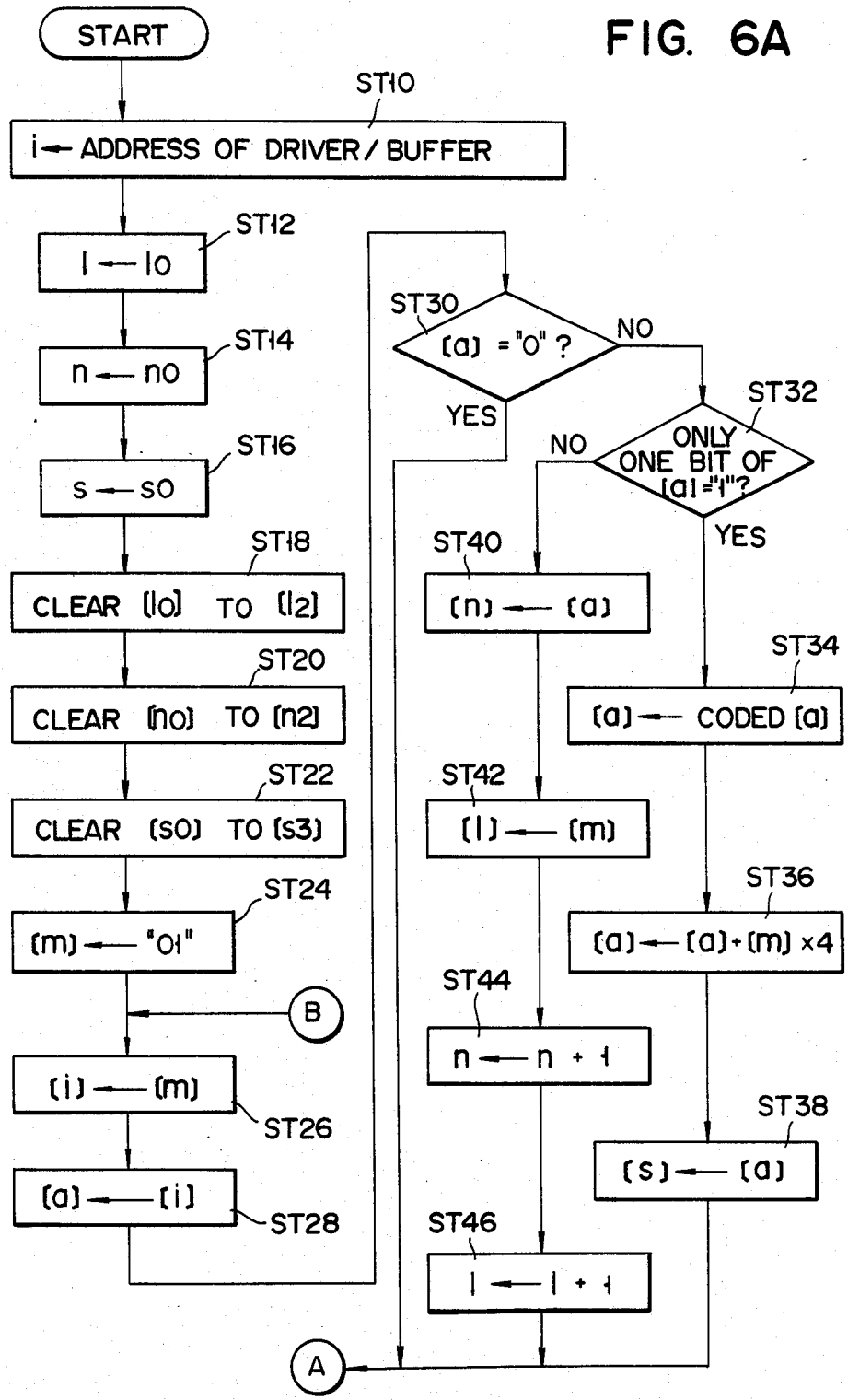
FIGS. 6A and 6B show flow charts explaining the operation of the apparatus shown in FIG. 3.
Figure 6B:
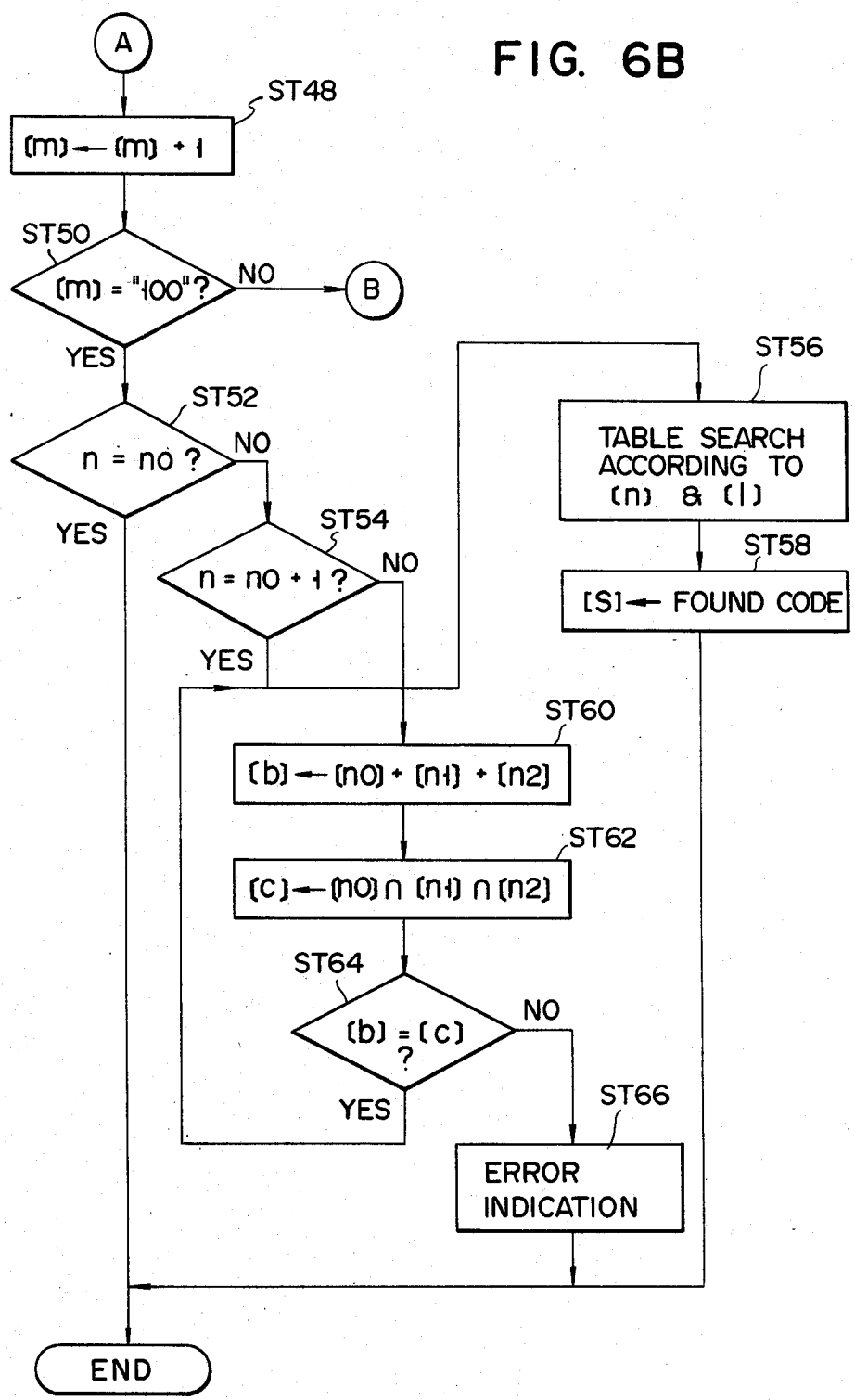

FIGS. 6A and 6B show flow charts explaining the operation of the apparatus shown in FIGS. 3 to 5.

Firstly, predetermined address data AD0, AD1 for driver 2 and predetermined address data AX0 to AX2 for buffer gate 3 are stored in i address register (ST10). Given data $1_0$ (e.g., "01") is stored in 1 address register which is provided for Table 1 (ST12). Given data $n_0$ (e.g., "011") is stored in n address register which is provided for Table 2 (ST14). Given data $s_0$ (e.g., "0000") is stored in s address register which is provided for Table 3 (ST16). Thereafter, all contents $[1_0]$ to $[1_2]$ of 1 register (Table 1) are cleared (ST18). All contents $[n_0]$ to $[n_2]$ of n register (Table 2) are cleared (ST20). All contents $[s_0]$ to $[s_3]$ of s register (Table 3) are cleared (ST22). Then, initial data "01" is stored in m line number register which is provided for storing row line number m of switch matrix $SW_{mn}$ (ST24).

The contents [m] of m line number register is transferred to i address register (ST26). The contents [i] of i register is transferred to a sense signal register which is provided for storing the contents of sense signals SS1 to SS3 (ST28). Thereafter, whether or not the contents of a register are "0" is checked (ST30). If [a]="0" (YES at ST30), the flow is jumped to step ST48 (FIG. 6B). However, since [a] is not "0" as seen from the preceding flow of steps ST24 to ST28 (NO at ST30), the program sequence is advanced to step ST32. In step ST32, whether or not only one bit of [a] is "1" is checked. Since only one bit of [a] is "1" from step ST24 (YES at ST32), [a] is coded according to Table 4 or to a prescribed arithmetic operation corresponding to Table 4 (ST34). For instance, when [a]="001", the coded [a]="001". If [a]="100", the coded [a]="011". Then, the following arithmetic operation is performed in the ALU of microcomputer 1:

$$[a]+[m]\times 4 \tag{1}$$

In Eq. (1), the multiplication "×4" for binary data is equivalent to a two-bit-shift-left. The result of arithmetic operation of Eq. (1) is transferred to a register (ST36). The contents [a] of a register is transferred to s register (ST38), and the flow is advanced to step ST48 in FIG. 6B.

In step ST48, the contents [m] is incremented by "1". When [m]="01" before ST48, [m] becomes "10" after ST48. When [m]="11" before ST48, [m] becomes "100" after ST48. After step ST48, whether or not [m] is "100" is checked (ST50). When [m]="10" (NO at ST50), the flow is returned to step ST26 (FIG. 6A). Then, circulation in the loop of steps ST26 to ST50 is repeated until [m]="100" is obtained. When [m]="100" (YES at ST50), whether or not n is equal to $n_0$ is checked (ST52). Since the flow is passing through YES at ST32, $n=n_0$ is established from ST14 (YES at ST52). Then, one operation of the flow in FIGS. 6A and 6B is finished (END). In this case, "$s=s_0$" obtained at ST16 (YES at ST30) or "s" obtained at ST38 (NO at ST30) indicates the switch selection state of switch matrix $SW_{mn}$. The result "$s=s_0$" represents that none of switches $SW_{11}$ to $SW_{33}$ is turned-on. After elapsing a given period of time, the flow may be automatically returned from END to START.

When the contents [a] of a register include two or more bits of "1" (FIG. 6A, NO at ST32), [a] is transferred to n register (ST40). Thereafter, the contents [m] of m register is transferred to 1 register (ST42). Then, n is incremented by "1" (ST44), and 1 is incremented by "1" (ST46). For instance, when $n=n_0$ before ST44, n becomes $n_1$ after ST44 (see Table 2). Similarly, when $1=1_0$ before ST46, 1 becomes $1_1$ after ST46 (see Table 1). After step ST46, the above circulation in the loop of steps ST26 to ST50 is repeated until [m]="100" is obtained. When [m]="100" (YES at ST50), whether or not n is equal to $n_0$ is checked (ST52). Since the flow is passing through NO at ST32, $n=n_0$ is not established from ST44 (NO at ST52) and the program flow is advanced to step ST54.

In step ST54, whether or not n is equal to $n_0+1$ is checked. When $n=n_1$ has been obtained by the former step ST44, $n=n_0+1$ is established (YES at ST54). Then, a table search for Table 6 according to [n] obtained at ST44 and [1] at ST46 is carried out (ST56). According to the combination of [1] and [n], detection code [s] is found out from Table 6 (ST58). Then, another operation of the flow in FIGS. 6A and 6B is finished (END). In this case, [s] obtained at ST58 (YES at ST54) indicates two or more simultaneously depressed switches in matrix $SW_{mn}$. After elapsing a given period of time, the flow may be automatically returned from END to START.

When $n=n_0+1$ is not established (NO at ST54), or $n_0$, $n_1$ and $n_2$ have been obtained through repetitions of loops of ST26 to ST50, the result of an arithmetic add of contents $[n_0]+[n_1]+[n_2]$ is transferred to b register (ST60). Thereafter, the result of a logical OR of contents $[n_0] \cap [n_1] \cap [n_2]$ is transferred to c register (ST62). Then, whether or not [b] is equal to [c] is checked (ST64). When [b]=[c] is established (YES at ST64), the flow is advanced to ST56 and [s] is obtained from the table search of Table 6 (ST56 & ST58). When [b]=[c] is not established (NO at ST64), the flow is advanced to step ST66. NO at step ST64 means that an inhibited combination of switches in matrix $SW_{mn}$ is selected by an erroneous manipulation of an operator or by an erroneous circuit operation due to signal leakages. Such an erroneous manipulation is detected by microcomputer 1 and is indicated at error indicator 4 (ST66).

Incidentally, the table search at step 56 (Table 6) may be replaced by an arithmetic operation. Such an arithmetic operation may be as follows:

Suppose that [1]="01", [n]="110" (cf. 3rd row in Table 6), [y]="010" and [y]="100". Information [y] corresponds to [s] and is derived from [n]. That is, [y]="010" is obtained from the right two bits "10" of [n]="110", and [y]="100" is obtained from the left one bit "1" of [n]="110".

TABLE 7

| [y] | CODED [y] |
|---|---|
| 001 | 001 |

TABLE 7-continued

| [y] | CODED [y] |
|---|---|
| 010 | 010 |
| 100 | 011 |

According to Table 7, [y]="010" is coded to "010", and [y]="100" is coded to "011". Then, the following arithmetic operation is performed:

$$[s] = [\text{coded } y] + [1] \times 4 \qquad (2)$$

From Eq. (2), when [coded y]="010" and [1]="01", [s]="0110" is obtained. When [coded y]="011" and [1]="01", [s]="0111" is obtained. Thus, the arithmetic operation of Eq. (2) provides the same function of the table search in step ST56 (see 3rd row in Table 6).

Now, explanation will be given to some cases wherein a signal leakage occurs in switch matrix $SW_{mn}$ or wherein no signal leakage occurs.

First, a case wherein only $SW_{13}$ is turned-on is considered (no signal leakage occurs).

Microcomputer 1 (FIG. 3) supplies data D2 to driver 2. In this case, CS="1", WRITE="1", AD0="1" and AD1="0". Thus, address data [AD1, AD0]="01" is inputted to data latch 21 in FIG. 4 and the contents [m] of m register become "01" (ST24 in FIG. 6A). Then, the contents of ANDed outputs [E22C, E22B, E22A] become "001" and only transistor Q23A is turned-on, so that only the row line La1 receives drive signal DS1 having logic "0". Since only $SW_{13}$ is turned-on, only the column line Lb3 is connected to row line La1. Then, the contents of sense signals [SS3, SS2, SS1] become "011", and, according to the inverting operation of 3-state buffers 32A to 32C in FIG. 5, the contents of address data [AX0, AX1, AX2] become "100" which correspond to the contents [a] of a register. From [m]="01" and [a]="100", the contents [s] of detection code becomes "0111" (ST32–ST38 in FIG. 6A). From [s]="0111", microcomputer 1 provisionally judges that $SW_{13}$ is turned-on (4th row in Table 5).

After the provisional detection of [s]="0111", microcomputer 1 subsequently increments the contents [m] by 1 (ST48 in FIG. 6B), and the same operation as mentioned above is performed for [m]="10", [m]="11" and [m]="100" (ST26–ST50 in FIGS. 6A and 6B). Since no switches other than $SW_{13}$ are turned-on, [s]="0000" for [m]="10", "11" and "100" is detected. Then, microcomputer 1 judges that only $SW_{13}$ is turned-on.

Incidentally, when [a]="0" (YES at ST30 in FIG. 6A), microcomputer 1 judges that none of switches $SW_{11}$ to $SW_{33}$ is turned-on.

Next, a case wherein $SW_{11}$ and $SW_{21}$ are turned-on is considered (no signal leakage occurs).

Microcomputer 1 supplies data D2 containing CS="1", WRITE="1", AD0="1" and AD1="0". Thus, address data [AD1, AD0]="01" is inputted to data latch 21 and the contents [m] of m register become "01" (ST24 in FIG. 6A). Then, the contents of ANDed outputs [E22C, E22B, E22A] become "001" and only transistor Q23A is turned-on, so that only the row line La1 receives drive drive signal DS1 having logic "0". Since $SW_{11}$ is turned-on but $SW_{12}$ and $SW_{13}$ are turned-off, only the column line Lb1 is connected to row line La1. Then, the contents of sense signals [SS3, SS2, SS1] become "110", and therefore the contents of address data [AX0, AX1, AX2] become "001" which correspond to the contents [a] of a register. From [m]="01" and [a]="001", the contents [s] of detection code become "0101" (ST32–ST38 in FIG. 6A). From [s]="0101", microcomputer 1 provisionally judges that $SW_{11}$ is turned-on (9th row in Table 5).

After the provisional detection of [s]="0101", microcomputer 1 increments the contents [m] by 1 (ST48 in FIG. 6B), and the same operation as mentioned above is performed for [m]="10". Thus, address data [AD1, AD0]="10" is inputted to data latch 21 and the contents of ANDed outputs [E22C, E22B, E22A] become "010". Then, only transistor Q23B is turned-on so that only the row line La2 receives drive signal DS2 having logic "0". Since $SW_{21}$ is turned-on but $SW_{22}$ and $SW_{23}$ are turned-off, only the column line Lb1 is connected to row line La2. Then, the contents of sense signals [SS3, SS2, SS1] become "110", and the contents of address data [AX0, AX1, AX2] become "001" which correspond to the contents [a] of a register. From [m]="10" and [a]="001", the contents [s] of detection code become "1001" (ST32–ST38 in FIG. 6A). From [s]="1001", microcomputer 1 provisionally judges that $SW_{21}$ is turned-on (9th row in Table 5).

After the provisional detection of [s]="0101" and "1001", microcomputer 1 further increments the contents [m] by 1 (ST48 in FIG. 6B), and the same operation as mentioned above is performed for [m]="11" and [m]="100". Since no switches other than $SW_{11}$ and $SW_{21}$ are turned-on, [s]="0000" for [m]="11" and "100" is detected. Then, microcomputer 1 judges that only $SW_{11}$ and $SW_{21}$ are turned-on.

Next, a case wherein $SW_{12}$ and $SW_{13}$ are turned-on is considered (no signal leakage occurs).

Microcomputer 1 supplies data D2 containing CS="1", WRITE="1", AD0="1" and AD1="0". Thus, address data [AD1, AD0]="01" is inputted to data latch 21 and the contents [m] of m register become "01" (ST24 in FIG. 6A). Then, the contents of ANDed outputs [E22C, E22B, E22A] become "001" and only transistor Q23A is turned-on, so that only the row line La1 receives drive signal DS1 having logic "0". Since $SW_{11}$ is turned-off while $SW_{12}$ and $SW_{13}$ are turned-on, column lines Lb2 and Lb3 are connected to row line La1. Then, the contents of sense signals [SS3, SS2, SS1] become "001", and the contents of address data [AX0, AX1, AX2] become "110" which correspond to the contents [a] of a register. Since [a] contains two bits of "1" (NO at ST32 in FIG. 6A), data n is incremented by 1 (ST44 in FIG. 6A) and the flow is advanced to step ST52 in FIG. 6B. In this case, data n is not equal to $n_0$ (NO at ST52) but is equal to $n_0+1$ (YES at ST54). Accordingly, the flow is advanced to ST56 and ST58. Then, from [m]="01" and [a]="110", the contents [s] of detection code becomes "0110" and "0111" (ST40–ST58 in FIGS. 6A and 6B). From [s]="0110" and "0111", microcomputer 1 provisionally judges that $SW_{12}$ and $SW_{13}$ are turned-on (6th row in Table 5).

After the provisional detection of [s]="0110" and "0111", microcomputer 1 subsequently increments the contents [m] by 1 (ST48 in FIG. 6B), and the same operation as mentioned above is performed for [m]="10", [m]="11" and [m]="100" (ST26–ST50 in FIGS. 6A and 6B). Since no switches other than $SW_{12}$ and $SW_{13}$ are turned-on, [s]="0000" for [m]="10", "11" and "100" is detected. Then, microcomputer 1 judges that only $SW_{12}$ and $SW_{13}$ are turned-on.

Next, a case wherein $SW_{11}$, $SW_{12}$ and $SW_{21}$ are turned-on is considered (a signal leakage occurs).

Microcomputer 1 supplies data D2 containing CS="1", WRITE="1", AD0="1" and AD1="0", and the contents [m] of m register become "01" (ST24 in FIG. 6A). Then, the contents of ANDed outputs [E22C, E22B, E22A] become "001" so that only the row line La1 receives drive signal DS1 having logic "0". Since $SW_{11}$ and $SW_{12}$ are turned-on while $SW_{13}$ is turned-off, column lines Lb1 and Lb2 are connected to row line La1. Then, the contents of sense signals [SS3, SS2, SS1] become "100", and the contents of address data [AX0, AX1, AX2] become "011" which correspond to the contents [a] of a register. Since [a] contains two bits of "1" (NO at ST32 in FIG. 6A), data n is incremented by 1 (ST44 in FIG. 6A) and the flow is advanced to step ST52 in FIG. 6B. In this case, data n is not equal to $n_0$ (NO at ST52) but is equal to $n_0+1$ (YES at ST54). Accordingly, the flow is advanced to ST56 and ST58. Then, from [m]="01" and [a]="011", the contents [s] of detection code becomes "0101" and "0110" (ST40-ST58 in FIGS. 6A and 6B). From [s]="0101" and "0110", microcomputer 1 provisionally judges that $SW_{11}$ and $SW_{12}$ are turned-on. (This corresponds to the condition of 3rd row in Table 5).

After the provisional detection of [s]="0101" and "0110", microcomputer 1 increments the contents [m] by 1 (ST48 in FIG. 6B), and the same operation as mentioned above is performed for [m]="10". Thus, address data [AD1, AD0]="10" is inputted to data latch 21 and only transistor Q23B is turned-on so that only the row line La2 receives drive signal DS2 having logic "0".

Here, since $SW_{21}$ is turned-on but $SW_{22}$ and $SW_{23}$ are turned-off, if a signal leakage does not occur, only the column line Lb1 is connected to row line La2. However, since $SW_{11}$ and $SW_{12}$ are also turned-on, a signal leakage occurs so that the column line Lb2 is erroneously connected to row line La2 via ONed switches $SW_{11}$ and $SW_{12}$. Thus, row line La2 is connected not only to column line Lb1 but also to column line Lb2.

Then, the contents of sense signals [SS3, SS2, SS1] become "100", and the contents of address data [AX0, AX1, AX2] become "011" which correspond to the contents [a] of a register. Since [a] contains two bits of "1" (NO at ST32 in FIG. 6A), data n is incremented by 1 (ST44 in FIG. 6A) and the flow is advanced to step ST52 in FIG. 6B. In this case, data n is not equal to $n_0$ (NO at ST52) nor to $n_0+1$, but is equal to $n_0+2$ (NO at ST54) because the flow passes the step ST44 two times until now. Accordingly, the flow is advanced to step ST60.

When [m]="01", then [l]=[$l_0$]="01" and [n]=[$n_0$]="011". When [m]="10", then [l]=[$l_1$]="10" and [n]=[$n_1$]="011" because of the signal leakage. In step ST60, arithmetic operation (binary addition) of [b]=[$n_0$]+[$n_1$]="011"+"011"="110" is performed. Then, in step ST62, logical OR operation of [c]=[$n_0$]∩[$n_1$]="011"∩"011"="011" is performed. Since [b]="110" is not equal to [c]="011" (NO at ST64), the said provisional detection of [s]="0101" and "0110" is cancelled ([s]="xxxx" on 11th row in Table 5) and an error indication is performed (ST66).

By the error detection of [s]="xxxx", microcomputer 1 judges that one of inhibited combinations of switches in switch matrix $SW_{mn}$ is erroneously selected by an operator. In Table 5, some inhibited combinations of the switches are indicated at *11, *13 and *15 rows.

After elapsing a given period of time, the flow of FIGS. 6A and 6B is automatically returned to START.

As mentioned above, according to an embodiment of the present invention, the combination of one or more simultaneously turned-on switches of switch matrix $SW_{mn}$ is detected according to the input address data (D2 or [m]) and the output address data (D3 or [a]), without requiring leakage-blocking devices such as diodes dj in FIG. 1. Further, if any of inhibited combinations of switches is erroneously selected, such an error is indicated and erroneous operation due to the inhibited combinations of switches is completely avoided.

The present invention should not be limited to the embodiment described above. This invention may be variously embodied within the claimed scope. For instance, when multiple depressing of switches causes an error, such an error may be memorized in a manner that a flag bit register (not shown) stores bit data "1" according to the result of the error detection (NO at ST64 in FIG. 6B). When the contents of the flag bit register is "1", a main apparatus (not shown), which is to be controlled by microcomputer 1 according to the manipulation of switch matrix $SW_{mn}$, may be disenabled unless all switches of $SW_{mn}$ are once turned-off. Further, such a main apparatus may be enabled only when two or more correct manipulations of switch matrix $SW_{mn}$ are carried out, thereby increasing the reliability of the apparatus.

Incidentally, the present invention may be applied to the apparatus of the following prior art publications:
(1) Electronics; Apr. 19, 1984, pp. 140–144 "Touch screens let your fingers provide a fast, simple entry into the computer"
(1) U.S. Pat. No. 4,413,314 issued on Nov. 1, 1983 (Slater et al.)

All disclosures of the above two publications are now incorporated in the present application.

What is claimed is:

1. An input data reader apparatus comprising:
   a switch array being formed of a plurality of switches and having input lines and output lines, one or more of said output lines being connected to one or more of said input lines according to a switch selection state of said switch array;

driver means for supplying drive signals to the respective input lines of said switch array and defining input address data representing a line selection state of the input lines;

buffer means coupled to the output lines of said switch array and being responsive to sense signals which are obtained in accordance with the contents of the drive signals and with the switch selection state of said switch array and wherein said sensed signals are formed of a plurality of bits, for generating output address data representing a line selection state of the output lines;

detector means having a memory portion for storing a reference table and coupled to said driver means and said buffer means, for detecting a combination of one or more simultaneously turned-on switches of said switch array according to the input address data and the output address data; and a 1 register contained within said detector means which stores an address number of the input line of said switch array when two or more bits of said sense signals have a prescribed logic level, said address number being utilized for the detection of said combination of one or more simultaneously turned-on switches.

2. An apparatus according to claim 1, wherein said detector means includes an n register which stores an address number of the output line of said switch array when two or more bits of said sense signals have a given logic level, said address numbers of the input and output lines being utilized for the detection of said combination of one or more simultaneously turned-on switches.

3. An apparatus according to claim 2, wherein said detector means includes an s register which stores a result of the detection of said combination of one or more simultaneously turned-on switches.

4. An apparatus according to claim 3, wherein said reference table indicates the correspondence between the ON of any of said switches and the result of said detection.

5. An apparatus according to claim 1, wherein said sense signals are formed of a plurality of bits, and said detector means includes an n register which stores an address number of the output line of said switch array when two or more bits of said sense signals have a given logic level, said address number being utilized for the detection of said combination of one or more simultaneously turned-on switches.

6. An input data reader apparatus comprising:
a switch array being formed of a plurality of switches and having input lines and output lines, one or more of said output lines being connected to one or more of said input lines according to a switch selection state of said switch array;
driver means for supplying drive signals to the respective input lines of said switch array and defining input address data representing a line selection state of the input lines;
buffer means coupled to the output lines of said switch array and being responsive to sense signals which are obtained in accordance with the contents of the drive signals and with the switch selection state of said switch array and wherein said sensed signals are formed of a plurality of bits, for generating output address data representing a line selection state of the output lines;
detector means having a memory portion for storing a reference table and coupled to said driver means and said buffer means, for detecting a combination of one or more simultaneously turned-on switches of said switch array according to the input address data and the output address data; and
an n register contained within said detector means which stores an address number of the output line of said switch array when two or more bits of said sense signals have a given logic level, said address number being utilized for the detection of said combination of one or more simultaneously turned-on switches.

7. An input data reader apparatus comprising:
a switch array being formed of a plurality of switches and having input lines and output lines, one or more of said output lines being conected to one or more of said input lines according to a switch selection state of said switch array;
driver means for supplying drive signals to the respective input lines of said switch array and defining input address data representing a line selection state of the input lines;
buffer means coupled to the output lines of said switch array and being responsive to sense signals which are obtained in accordance with the contents of the drive signals and with the switch selection state of said switch array and wherein said sensed signals are formed of a plurality of bits, for generating output address data representing a line selection state of the output lines;
detector means coupled to said driver means and said buffer means, for detecting a combination of one or more simultaneously turned-on switches of said switch array according to the input address data and the output address data; and
an n register contained within said detector means which stores an address number of the output line of said switch array when two or more bits of said sense signals have a given logic level, said address number of the output line being utilized for the detection of said combination of one or more simultaneously turned-on switches.

8. An apparatus according to claims 1, 6 or 7 wherein said detector means has a function to find out an error in the detection of said combination of one or more simultaneously turned-on switches in order to indicate or inform an error.

9. An apparatus according to claim 8, wherein said detector means includes an n register which stores an address number of the output line of said switch array when two or more bits of said sense signals have a given logic level, said address number of the output line being utilized for the detection of said combination of one or more simultaneously turned-on switches.

10. An apparatus according to claim 9, wherein said detector means includes:
add means for arithmetically adding the contents of said n register and providing an added result;
logical OR means for obtaining a logical OR of the contents of said n register and providing an ORed result; and
error check means for comparing said added result with said ORed result, and indicating an error in the detecting operation of said detector means when said added result differs from said ORed result.

11. An input data reader apparatus comprising:
a switch array being formed of a plurality of switches and having input lines and output lines, one or more of said output lines being connected to one or more of said input lines according to a switch selection state of said switch array;
driver means for supplying drive signals to the respective input lines of said switch array and defining input address data representing a line selection state of the input lines;
buffer means for supplying drive signals to the respective input lines of said switch array and defining input address data representing a line selection state of the input lines;
detector means coupled to said driver means and said buffer means, for detecting a combination of one or more simultaneously turned-on switches of said switch array according to the input address data and the output adress data, and for detecting an error in the detection of said combination of one or more simultaneously turned-on switches in order to indicate said detected error; and
an n register contained within said detector means which stores an address number of the output line of said switch array when two or more bits of said sense signals have a given logic level, said address number of the output line being utilized for the detection of said combination of one or more simultaneously turned-on switches.

12. An apparatus according to claims 1, 6, 7 or 11 wherein said detector means includes an arithmetic operating portion for serving the detection of said combination of one or more simultaneously turned-on switches.

13. An apparatus according to claims 7 or 11, wherein said detector means includes a memory portion for storing a reference table which is used for the detection of said combination of one or more simultaneously turned-on switches.

14. An apparatus according to claims 1, 6 or 11 wherein said sense signals are formed of a plurality of bits, and said detector means includes an n register which stores an address number of the output line of said switch array when two or more bits of said sense signals have a given logic level, said address number of the output line being utilized for the detection of said combination of one or more simultaneously turned-on switches.

15. An apparatus according to claim 14, wherein said detector means includes:
   add means for arithmetically adding the contents of said n register and providing an added result;
   logical OR means for obtaining a logical OR of the contents of said n register and providing an ORed result; and
   comparison means for comparing said added result with said ORed result, and enabling the detecting operation of said detector means when said added result coincides with said ORed result.

16. An apparatus according to claim 15, wherein said detector means includes an 1 register which stores an address number of the input line of said switch array when two or more bits of said sense signals have a prescribed logic level, said address numbers of the input and output lines being utilized for the detection of said combination of one or more simultaneously turned-on switches.

17. An apparatus according to claim 14, wherein said detector means includes:
   add means for arithmetically adding the contents of said n register and providing added result;
   logical OR means for obtaining a logical OR of the contents of said n register and providing an ORed result; and
   comparison means for comparing said added result with said ORed result, and enabling the detecting operation of said detector means when said added result coincides with said ORed result.

18. An apparatus according to claim 17, wherein said detector means includes a 1 register which stores an address number of the input line of said switch array when two or more bits of said sense signals have a prescribed logic level, said address numbers of the input and output lines being utilized for the detection of said combination of one or more simultaneously turned-on switches.

19. An apparatus according to claim 11, wherein said detector means includes:
   add means for arithmetically adding the contents of said n register and providing an added result;
   logical OR means for obtaining a logical OR of the contents of said n register and providing an ORed result; and
   error check means for comparing said added result with said ORed result, and indicating an error in the detecting operation of said detector means when said added result differs from said ORed result.

* * * * *